US012757312B2

(12) United States Patent
Lee et al.

(10) Patent No.: US 12,757,312 B2
(45) Date of Patent: Oct. 6, 2026

(54) EXTREME ULTRAVIOLET LIGHT SOURCE DEVICE

(71) Applicant: Samsung Electronics Co., Ltd., Suwon-si (KR)

(72) Inventors: Injae Lee, Suwon-si (KR); Sunghyup Kim, Suwon-si (KR); Yebin Nam, Suwon-si (KR); Daegeun Yoon, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 490 days.

(21) Appl. No.: 18/338,789

(22) Filed: Jun. 21, 2023

(65) Prior Publication Data

US 2024/0121877 A1 Apr. 11, 2024

(30) Foreign Application Priority Data

Oct. 11, 2022 (KR) ........................ 10-2022-0129556

(51) Int. Cl.

*H05G 2/00* (2006.01)
*G02B 19/00* (2006.01)
*G03F 7/00* (2006.01)
*G21K 1/06* (2006.01)

(52) U.S. Cl.

CPC ....... *H05G 2/0092* (2024.08); *G03F 7/70033* (2013.01); *G03F 7/70916* (2013.01); *H05G 2/009* (2024.08); *G02B 19/0019* (2013.01); *G21K 1/06* (2013.01)

(58) Field of Classification Search

CPC .. H05G 2/0092; H05G 2/009; G03F 7/70033; G03F 7/70916; G02B 19/0019; G21K 1/06

See application file for complete search history.

(56) References Cited

U.S. PATENT DOCUMENTS

2012/0298134 A1 11/2012 Moriya et al.
2018/0173117 A1 6/2018 Chien et al.
2020/0314989 A1 10/2020 Yang et al.
(Continued)

FOREIGN PATENT DOCUMENTS

KR 10-2020-0133740 A 11/2020
WO WO-2019-185406 A1 10/2019

*Primary Examiner* — Georgia Y Epps
*Assistant Examiner* — Hanway Chang
(74) *Attorney, Agent, or Firm* — Harness, Dickey & Pierce, P.L.C.

(57) ABSTRACT

An extreme ultraviolet light source device includes a chamber having a lower surface on which a condensing mirror is arranged, an intermediate focus, and a side surface between the lower surface and an upper surface a first exhaust port and a second exhaust port on the upper surface and spaced apart from the intermediate focus; a droplet supply adjacent to the side surface of the chamber, and configured to supply a droplet to generate the extreme ultraviolet light into the chamber; a light source configured to generate the extreme ultraviolet light by oscillating a laser; a catch adjacent to the side surface of the chamber, opposite to the droplet supply, and configured to receive the droplet discharged from the droplet supply unit; a first exhaust connected to the first exhaust port; and a second exhaust adjacent to the upper surface of the chamber, and connected to the second exhaust port.

19 Claims, 13 Drawing Sheets

II-II'

(56) References Cited

U.S. PATENT DOCUMENTS

| | | | | |
|---|---|---|---|---|
| 2020/0314990 | A1 | 10/2020 | Chen et al. | |
| 2021/0033983 | A1* | 2/2021 | Chen | G03F 7/70033 |
| 2021/0173316 | A1 | 6/2021 | Wu et al. | |
| 2021/0227676 | A1 | 7/2021 | Cheng et al. | |
| 2022/0104336 | A1* | 3/2022 | Kim | G03F 7/70916 |

* cited by examiner

EXTREME ULTRAVIOLET LIGHT SOURCE DEVICE

CROSS-REFERENCE TO RELATED APPLICATION

This application claims the priority and benefit of Korean Patent Application No. 10-2022-0129556, filed on Oct. 11, 2022, with the Korean Intellectual Property Office, the inventive concept of which is incorporated herein by reference.

BACKGROUND

Various example embodiments relate to an extreme ultraviolet light source device.

As a semiconductor device is highly integrated and miniaturized, a technique for forming circuit patterns of the semiconductor device to have a smaller size is required or desired. In order to meet these technical expectations, a wavelength of a light source used in a photolithography process is becoming shorter. Recently, an extreme ultraviolet exposure process using extreme ultraviolet (EUV) having a wavelength of 13.5 nm has been proposed.

SUMMARY

Various example embodiments provide an extreme ultraviolet light source device in which contamination by debris and outflow of debris are prevented or reduced in likelihood of occurrence or in impact from occurring.

According to various example embodiments, an extreme ultraviolet light source device includes a chamber having a lower surface on which a condensing mirror is arranged, an upper surface having an intermediate focus that is configured to have extreme ultraviolet light reflected by the condensing mirror be emitted, and a side surface between the lower surface and the upper surface, the chamber having a first exhaust port on the side surface, and a second exhaust port on the upper surface to be spaced apart from the intermediate focus; a droplet supply adjacent to the side surface of the chamber, and configured to supply a droplet to generate the extreme ultraviolet light in the chamber; a light source adjacent to the lower surface of the chamber, and configured to generate the extreme ultraviolet light from the droplet by oscillating a laser; a catch adjacent to the side surface of the chamber, opposite to the droplet supply, and configured to receive the droplet discharged from the droplet supply; a first exhaust adjacent to the side surface of the chamber, and connected to the first exhaust port; and a second exhaust adjacent to the upper surface of the chamber, and connected to the second exhaust port.

Alternatively or additionally, an extreme ultraviolet light source device includes a chamber including a condensing mirror, and a body on the condensing mirror and having an intermediate focus configured to emit extreme ultraviolet light that is reflected by the condensing mirror, and first and second exhaust ports, spaced apart from the intermediate focus; a droplet supply configured to supply a droplet that generates the extreme ultraviolet light in the chamber; a light source configured to generate the extreme ultraviolet light from the droplet by oscillating a laser; a catch configured to receive the droplet discharged from the droplet supply; a first exhaust connected to the first exhaust port; and a second exhaust connected to the second exhaust port, wherein the first exhaust port is at a first level, and the second exhaust port is located on a second level, above the first level.

Alternatively or additionally according to various example embodiments an extreme ultraviolet light source device includes a chamber having an intermediate focus configured to have extreme ultraviolet light reflected by a condensing mirror be emitted, and at least one upper exhaust port, spaced apart from the intermediate focus by a first distance in a horizontal direction, and located within a second distance from the intermediate condensing point in a vertical direction; a droplet supply configured to supply a droplet for generating the extreme ultraviolet light in the chamber; a light source configured to generate the extreme ultraviolet light from the droplet by oscillating a laser; and a catch configured to receive the droplet discharged from the droplet supply.

Alternatively or additionally, according to various example embodiments, an extreme ultraviolet light source system includes a chamber having a condensing mirror, an intermediate focus configured to have extreme ultraviolet light, reflected by the condensing mirror, be emitted, and first and second exhaust ports between the condensing mirror and the intermediate focus; a droplet supply configured to supply a droplet to generate the extreme ultraviolet light in the chamber; a light source configured to generate the extreme ultraviolet light from the droplet by oscillating a laser; a catch configured to receive the droplet discharged from the droplet supply; a first exhaust configured to discharge a first rising airflow through the first exhaust port; and a second exhaust configured to discharge a second rising airflow through the second exhaust port.

BRIEF DESCRIPTION OF DRAWINGS

The above and other aspects, features, and/or advantages of various example embodiments will be more clearly understood from the following detailed description taken in conjunction with the accompanying drawings, in which.

DETAILED DESCRIPTION

Hereinafter, various example embodiments will be described with reference to the accompanying drawings as follows.

Figure 1A:
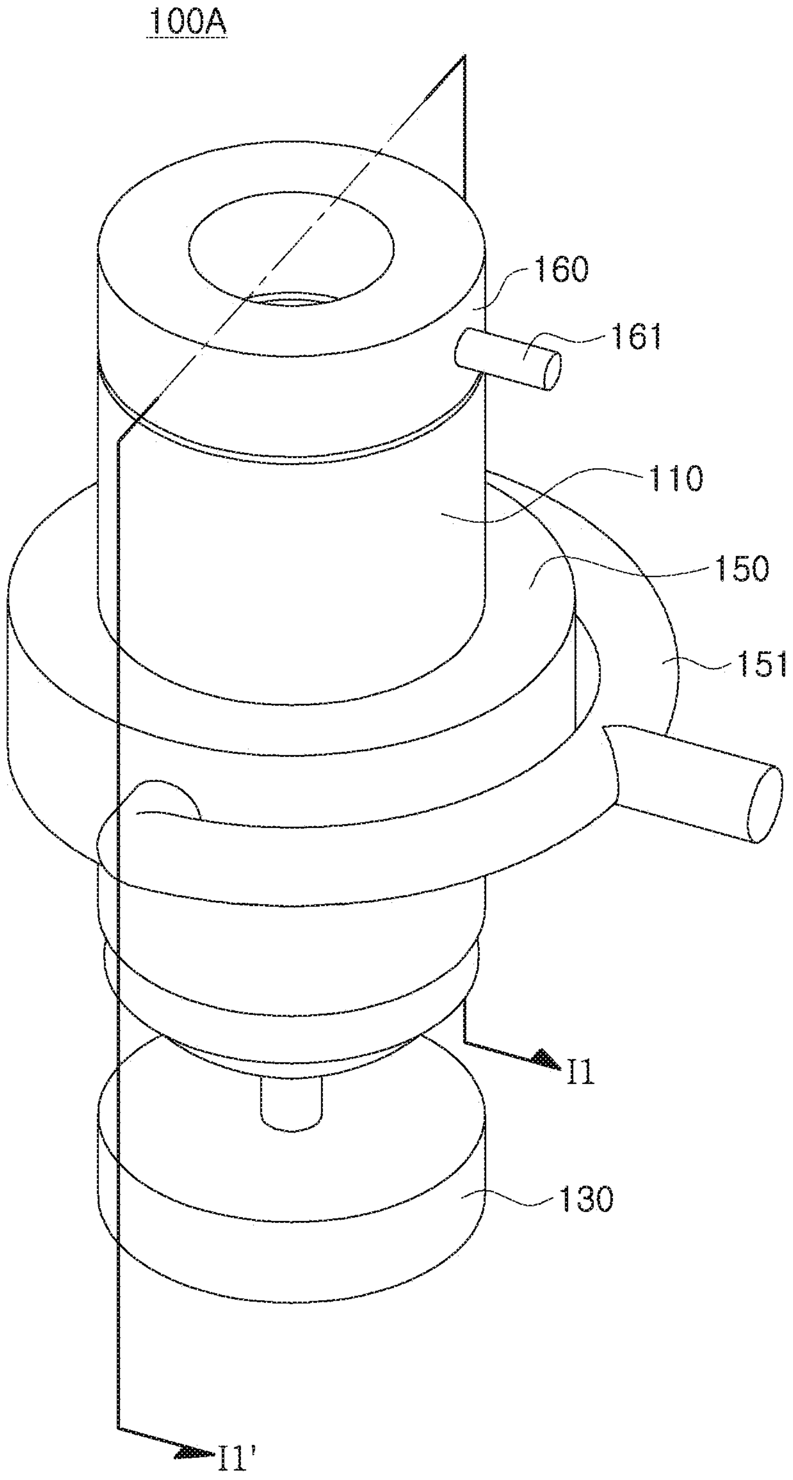
FIG. 1A is a perspective view schematically illustrating an extreme ultraviolet light source device according to various example embodiments.
Figure 1B:
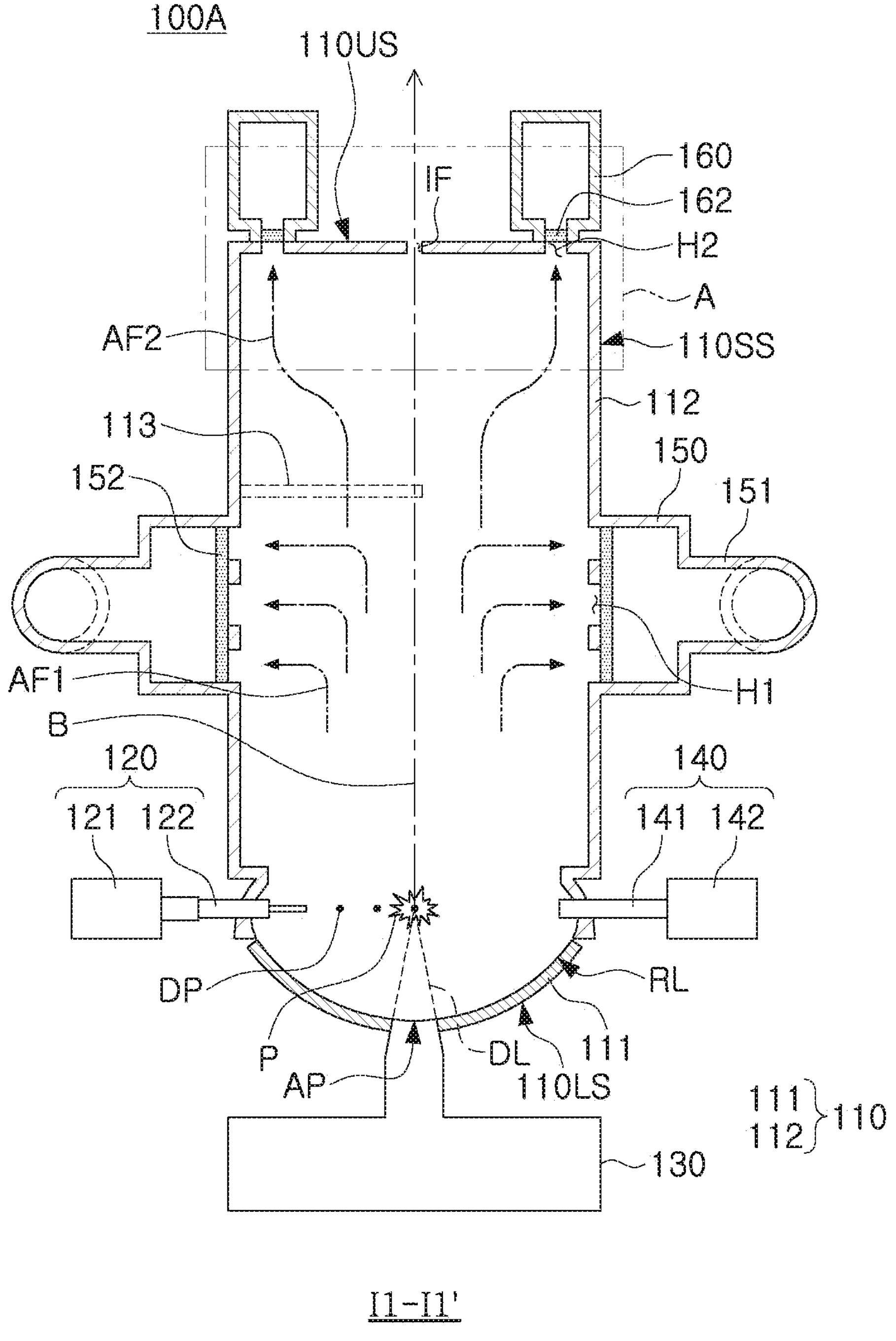
FIG. 1B is a cross-sectional view illustrating a cross-section taken along the line I1-I1' of FIG. 1A.
Figure 1C:
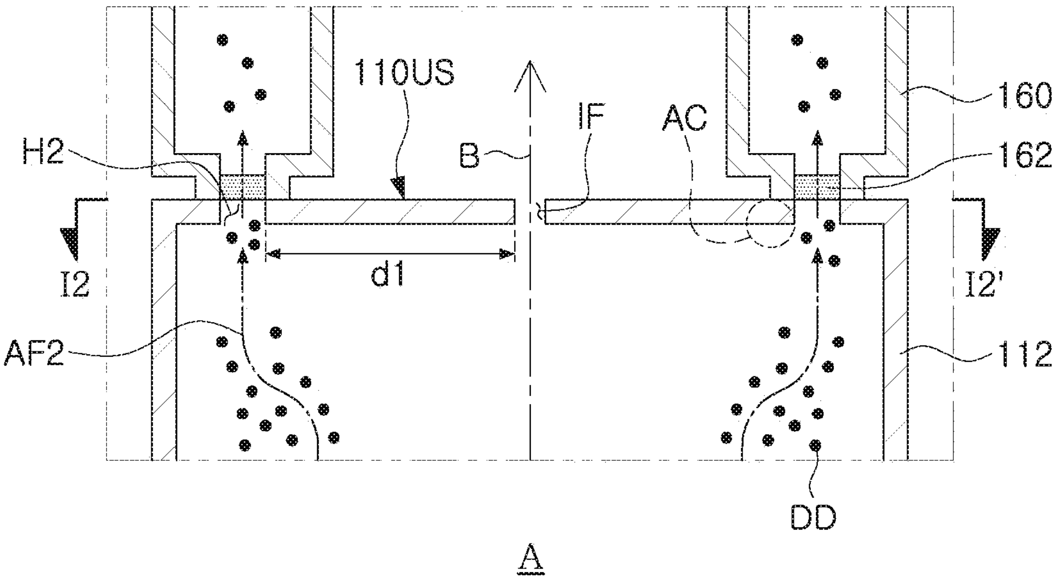
FIG. 1C is a partially enlarged view illustrating region A of FIG. 1B.

FIG. 1A is a perspective view schematically illustrating an extreme ultraviolet light source device 100A according to various example embodiments, FIG. 1B is a cross-sectional view illustrating a cross-section taken along line I1-I1' of FIG. 1A, and FIG. 1C is a partially enlarged view showing the region 'A' of FIG. 1B. For convenience of explanation, the droplet supply unit 120 and the catcher 140 illustrated in FIG. 1B are omitted in FIG. 1A.

Referring to FIGS. 1A to 1C, an extreme ultraviolet light source device 100A according to various example embodiments may include a chamber 110, a droplet supply or a droplet supply unit 120, a light source or a light source unit 130, and a catch or a catcher 140, as in a baseball catcher. In some example embodiments, the catcher 140 may have a bowl shape; however, example embodiments are not limited thereto. In addition, the EUV light source device 100A may further include exhaust units 150 and 160 for suctioning and/or discharging debris (see 'DD' in FIG. 1C) in the chamber 110.

The droplet supply unit 120 may be disposed on one side of the chamber 110, and may be configured to supply a droplet DP of a liquid target for generating extreme ultraviolet light B into the chamber 110. For example, the droplet supply unit 120 may be adjacent to a side surface 110SS of the chamber 110. The droplet supply unit 120 may include a droplet supply source 121 and a droplet discharge unit 122. The droplet supply source 121 may supply a target material for forming the droplet DR The target material may be formed of materials such as one or more of tin (Sn), lithium (Li), and xenon (Xe), and the droplet DP may be in a form of a liquefied target material and/or of a form in which a liquid material contains solid particles of the target material. The droplet DP may be discharged through the droplet discharge unit 122 by pressurizing the target material or a liquid version of the target material that is stored in the droplet supply source 121. Droplets DP may be continuously discharged and/or ejected from the droplet discharge unit 122 at a speed of about 20 to 70 m/s and at a time interval of about 20 ρs. In some example embodiments, the droplets DP may be ejected, e.g. accelerated horizontally with respect to the earth; example embodiments are not limited thereto.

After the droplet DP is discharged from the droplet discharge unit 122, the droplet DP may be irradiated, for example with a pre-pulse and a main pulse. The droplet DP may expand, e.g. expand in a pancake shape when irradiated with a pre-pulse, and may emit plasma P when a main pulse is irradiated therewith thereafter. In some example embodiments, the droplet DP irradiated with the main pulse may explode and leave debris DD. The debris DD may be formed of fine droplets, gas, or a mixture thereof. When the debris DD passes through an intermediate focus IF due to a strong airflow such as a strong rising airflow inside the chamber 110, the debris DD may be attached to or interact with a mask, or the like, to contaminate an exposure system (see FIG. 6). However, according to various example embodiments, since rising airflows AF1 and AF2 and/or the debris DD are discharged through the first and second exhaust ports H1 and H2, contamination of the exposure system by the debris DD may be prevented or reduced in likelihood of occurrence.

The light source unit 130 may be disposed below the chamber 110, and may be configured to generate extreme ultraviolet light B from the droplet DP by oscillating a laser DL. For example, the light source unit 130 may be adjacent to a lower surface 110LS of the chamber 110. The light source unit 130 is or includes a driver light source, and the oscillated laser DL may be provided in a form of a pulse wave. The laser DL may include a pre-pulse and a main-pulse. Before the main-pulse is absorbed by the droplet DP and interacts with the droplet DP, the pre-pulse may increase conversion efficiency by increasing a surface area of the droplet DP. The conversion efficiency may indicate or be or refer to a ratio of input power of the laser DL, oscillated by the light source unit 130 to output power of the emitted extreme ultraviolet light B.

The catcher 140 may be disposed on one side of the chamber 110, opposite to the droplet supply unit 120, and may be configured to receive the droplet DP discharged from the droplet supply unit 120. For example, the catcher 140 may be adjacent to a side surface 110SS of the chamber 110, opposite to the droplet supply unit 120. The catcher 140 may include a nozzle or nozzle unit 141 and a vacuum source 142. The nozzle unit 141 may be disposed to face the droplet discharge unit 122. Depending on example embodiments, a reflective layer may be formed on a surface of the nozzle unit 141 to reflect extreme ultraviolet light B. The vacuum source 142 may provide vacuum pressure, lower than or less than atmospheric pressure, inside the chamber 110 so that gas inside the chamber 110 is sucked through the nozzle unit 141. For example, the vacuum source 42 may provide differential pressure, at least 0.4 torr less than the atmospheric pressure inside the chamber 10.

The chamber 110 may include a condensing mirror 111 and a body 112. The chamber 110 may have a lower surface 110LS upon which the condensing mirror 111 is disposed, an upper surface 110US on which an intermediate focus IF is formed, and a side surface 110SS between the lower surface 110LS and the upper surface 110US. The upper surface 110US and the side surface 110SS of the chamber 110 may be defined by the body 112, and the lower surface 110LS of the chamber 110 may be defined by the condensing mirror 111. An interior of the chamber 110 may be filled with various gases, such as with hydrogen gas ($H_2$ gas) and/or oxygen gas (02 gas) in an ultra-low pressure state. For example, the interior of the chamber 110 may be filled with hydrogen gas and oxygen gas at a volume ratio of about 98.8:0.2. In order to prevent or reduce the likelihood of and/or impact of extreme ultraviolet light B generated inside the chamber 110 from being absorbed by gas inside the chamber 10, the interior of the chamber 110 may be maintained at a very low pressure.

The condensing mirror 111 may be disposed below the chamber 110 to condense the extreme ultraviolet light B toward the intermediate focus IF of the body 112. For example, the condensing mirror 111 may be or may include a long-axis ellipsoidal mirror having a first focal point in a region or adjacent to the region where the laser DL is irradiated to the droplet. DP, and having a second focal point at the intermediate focus IF. A reflective layer RL may be formed on one surface of the condensing mirror 111 to improve reflectivity of the extreme ultraviolet light B. The reflective layer RL may be formed of multiple thin film layers in which various film such as molybdenum-silicon (Mo—Si) is cross-stacked. A light source unit 130 configured to oscillate a laser DL may be disposed on the other surface of the condensing mirror 111. An optical aperture AP may be disposed in a central portion of the condensing mirror 111 to adjust an irradiation amount of the laser DL, oscillated by the light source unit 130.

In some example embodiments, the body 112 may be a cylindrical cover having a constant upper and lower width. An intermediate focus IF providing a path through which the generated extreme ultraviolet light B is emitted may be positioned at an upper end of the body 112. A droplet supply unit 120 for supplying a droplet DP may be disposed on one side of the body 112. A catcher 140 configured to receive the droplet DP that is discharged from the droplet supply unit 120 may be disposed on the other side of the body 112. Depending on example embodiments, a blocking film 113 overlapping at least a portion of an optical path of the extreme ultraviolet light B may be disposed inside the body 112. The blocking film 113 may block the laser DL provided by the light source unit 130 from being emitted externally at a certain portion.

According to various example embodiments, by forming at least one upper exhaust port, spaced apart from the intermediate focus IF at a distance, such as a dynamically determined distance (or, alternatively, a predetermined distance) in an upper portion of the chamber 110, a rising airflow in the chamber 110 is prevented or reduced from circulating inside the chamber 110. Alternatively or additionally, accumulation of debris DD on an inner wall of the chamber 110 is prevented or reduced by a circulation airflow. The debris DD may include fine droplets, gas, or a mixture thereof. In order to prevent or reduce circulation or re-circulation of the rising airflow, at least one upper exhaust port (e.g., 'a second exhaust port H2') may be located at the same level as or a level, lower than the intermediate focus IF (refer to example embodiments illustrated in FIG. 3A). Alternatively or additionally, in order to prevent or reduce debris DD from being accumulated in the vicinity of the intermediate focus IF, at least one upper exhaust port (e.g., 'a second exhaust port H2') may be horizontally spaced apart from the intermediate focus IF by a first distance d1. When at least one upper exhaust port (e.g., a 'second exhaust port H2') is formed or situated on a level, higher than or above the intermediate focus IF, a circulation airflow may be formed between the upper exhaust port (e.g., the 'second exhaust port 112') and the intermediate focus IF, or debris DD m accumulated near the intermediate focus IF.

As illustrated in FIG. 1C, at least a portion of the debris DD may pass through a scrubber 162 and may be discharged through an exhaust unit 160, but the debris DD that does not pass through the scrubber 162 may pass through the chamber 110 may accumulate the chamber 110. For example, an accumulation region ('AC' in FIG. 1C) of the debris DD may be formed around the upper exhaust port (e.g., the 'second exhaust port H2'). In this case, since spitting (or a spitting angle) of the accumulated debris DD toward the intermediate focus IF is blocked, the debris DD is prevented or reduced from passing through the intermediate focus IF. The first distance d1 may be about 100 mm or more, for example, in a range of about 100 mm to about 300 mm, about 150 mm to about 250 mm, about 150 mm to about 200 mm, but various example embodiments thereof is not limited thereto. Depending on the example embodiment, at least one lower exhaust port (e.g., the 'first exhaust port H1') may be formed in a lower portion of the chamber 110.

In various example embodiments, the chamber 110 may have a first exhaust port H1 and a second exhaust port H2. The first exhaust port H1 may be formed on a side surface 110SS of the chamber 110, and the second exhaust port H2 may be spaced apart from the intermediate focus IF and be formed on an upper surface 110US of the chamber 110. The second exhaust port H2 may be disposed more adjacent to the intermediate focus IF than the first exhaust port H1. For example, the first exhaust port H1 may be located on a first level, the second exhaust port H2 may be located on a second level, higher than or above the first level, and may be located on the second level, the same as that of the second exhaust port H2. The second exhaust port H2 may be spaced apart from the intermediate focus IF in a horizontal direction, perpendicular to an optical path of the extreme ultraviolet light B. A distance d1 between the second exhaust port H2 and the intermediate focus IF in the horizontal direction may be about 150 mm or more. The number and/or the shape of the first exhaust ports H1 and the second exhaust ports H2 may be variously modified (see FIGS. 2A to 2C).

Meanwhile, the extreme ultraviolet light source device 100A may include exhaust units 150 and 160 connected to the first exhaust port H1 and the second exhaust port H2. The exhaust units 150 and 160 may include exhaust pipes 151 and 161 having one end connected to a vacuum source to vacuum gas in the chamber 110. Depending on example embodiments, the exhaust units 150 and 160 may include scrubbers 152 and 162 disposed at each of the exhaust ports H1 and H2, but various example embodiments thereof is not limited thereto.

In various example embodiments, the extreme ultraviolet light source device 100A may further include a first exhaust port H1, adjacent to the side surface 110SS of the chamber 110 and connected to the first exhaust port H1 and a second exhaust port 160, adjacent to the upper surface 110US of the chamber 110 and connected to the second exhaust port H2. The first exhaust unit 150 may be configured to discharge a first rising airflow AF1 in the chamber 110 through the first exhaust port H1. The second exhaust unit 160 may be configured to discharge a second rising airflow AF2 in the chamber 110 through the second exhaust port H2. Accordingly, the formation of a falling and/or a circulating airflow inside the chamber 110 may be suppressed or at least partly suppressed, and as a result, the accumulation of debris DD having a spitting angle toward the intermediate focus IF may be prevented or reduced in likelihood of occurrence.

Hereinafter, with reference to FIGS. 2A to 2C, the arrangement and shape of the second exhaust port H2 of variously modified example will be described.

Figure 2A:
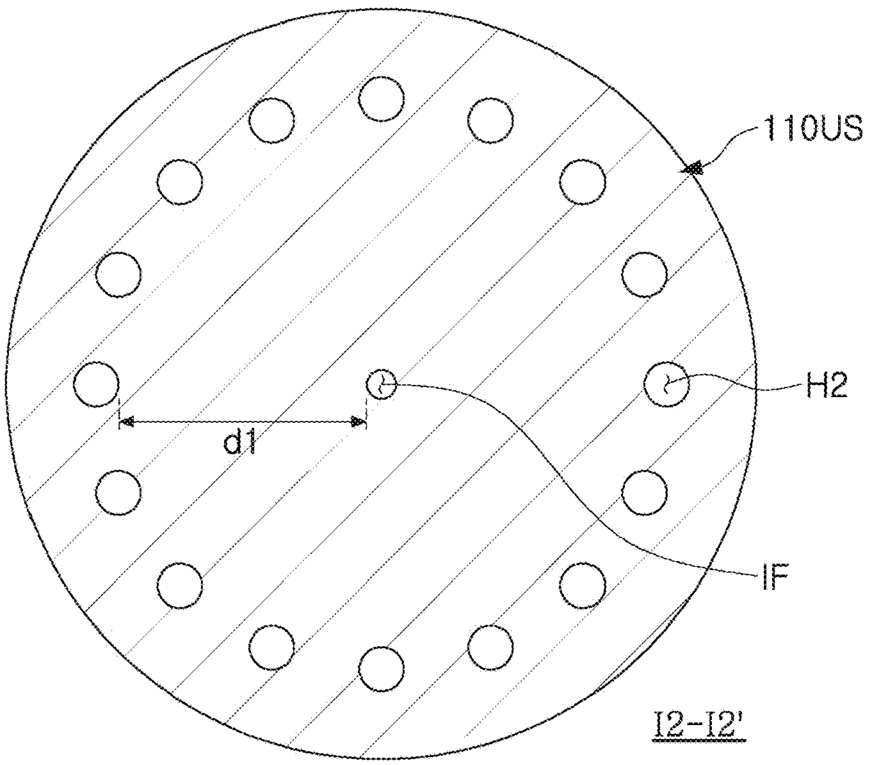
FIG. 2A is a cross-sectional view illustrating a cross-section taken along the line I2-I2' of FIG. 1C.
Figure 2B:
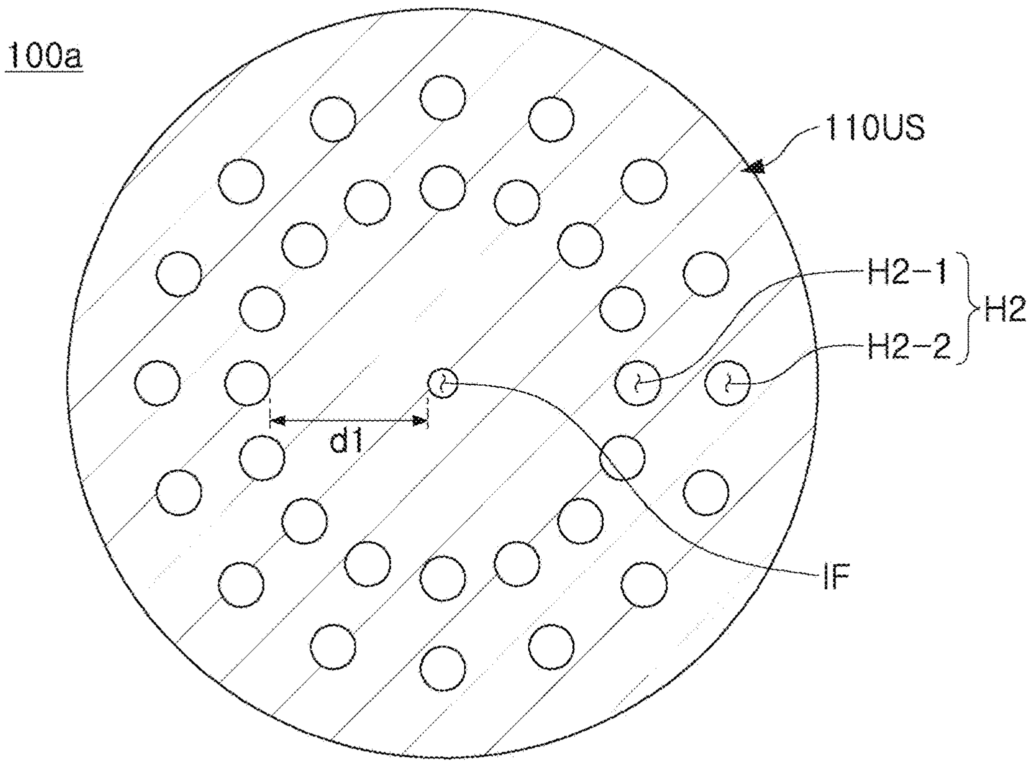
FIGS. 2B and 2C are cross-sectional views illustrating a partial region of an extreme ultraviolet light source device according to a modified example, respectively.
Figure 2C:
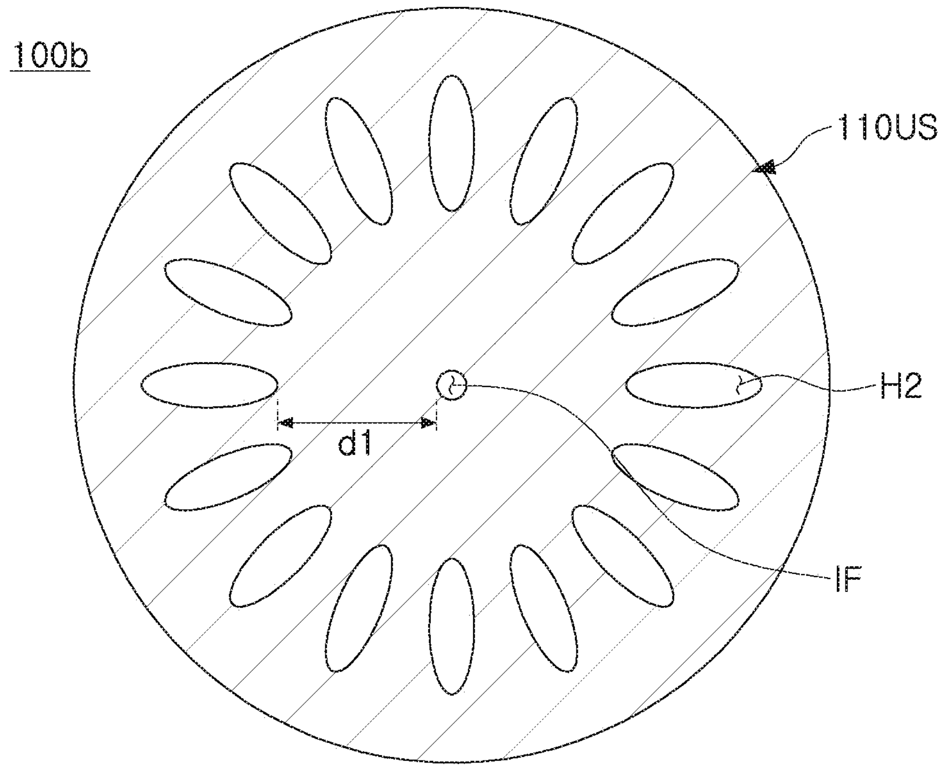

FIG. 2A is a cross-sectional view taken along line I2-I2' of FIG. 1C, and FIGS. 2B and 2C are cross-sectional views illustrating partial regions of extreme ultraviolet light source devices 100*a* and 100*b* according to modified examples, respectively.

Referring to FIG. 2A, the chamber 110 may include a plurality of second exhaust ports H2 formed to surround the intermediate light focus IF. The plurality of second exhaust ports H2 may be spaced apart from the intermediate focus IF by a first distance d1. The first distance d1 may be about 100 mm or more, but various example embodiments thereof is not limited thereto. Alternatively or additionally, the plurality of second exhaust ports H2 may be provided in more or less numbers than those illustrated in the drawings.

Alternatively or additionally, referring to FIG. 2B, in an extreme ultraviolet light source device 100*a* of a modified example, a plurality of second exhaust ports H2 may be disposed in a plurality of concentric circles. For example, the plurality of second exhaust ports H2 may include outer exhaust ports H2-2 adjacent to an edge of the upper surface 110US of the chamber 110, and inner exhaust ports H2-1 disposed between the outer exhaust ports H2-2 and the intermediate focus IF. In this case, the inner exhaust ports H2-1, adjacent to the intermediate focus IF, may be spaced apart from the intermediate focus IF by a first distance d1.

The outer exhaust ports H2-2 and the inner exhaust ports H2-1 may be provided in more or less numbers than shown in the drawings.

Alternatively or additionally, referring to FIG. 2C, in an extreme ultraviolet light source device 100*b* of a modified example, a plurality of second exhaust ports H2 may have an elliptical planar shape. For example, the plurality of second exhaust ports H2 may have an elliptical shape arranged such that a long axis faces an intermediate focus IF. The plurality of second exhaust ports H2 may have a polygonal shape in addition to the circular and elliptical shapes illustrated in FIGS. 2A to 2C.

As described above, the shape and/or the arrangement of the plurality of second exhaust ports H2 are not particularly limited, and may be variously modified. In addition, although not described with reference to the drawings, the arrangement and/or shape of the first exhaust port H1 are not particularly limited thereto. For example, the number of the first exhaust ports H1 (three) formed on one side of the chamber 110 in FIG. 1B, may be more or less than shown in the drawing.

Figure 3A:
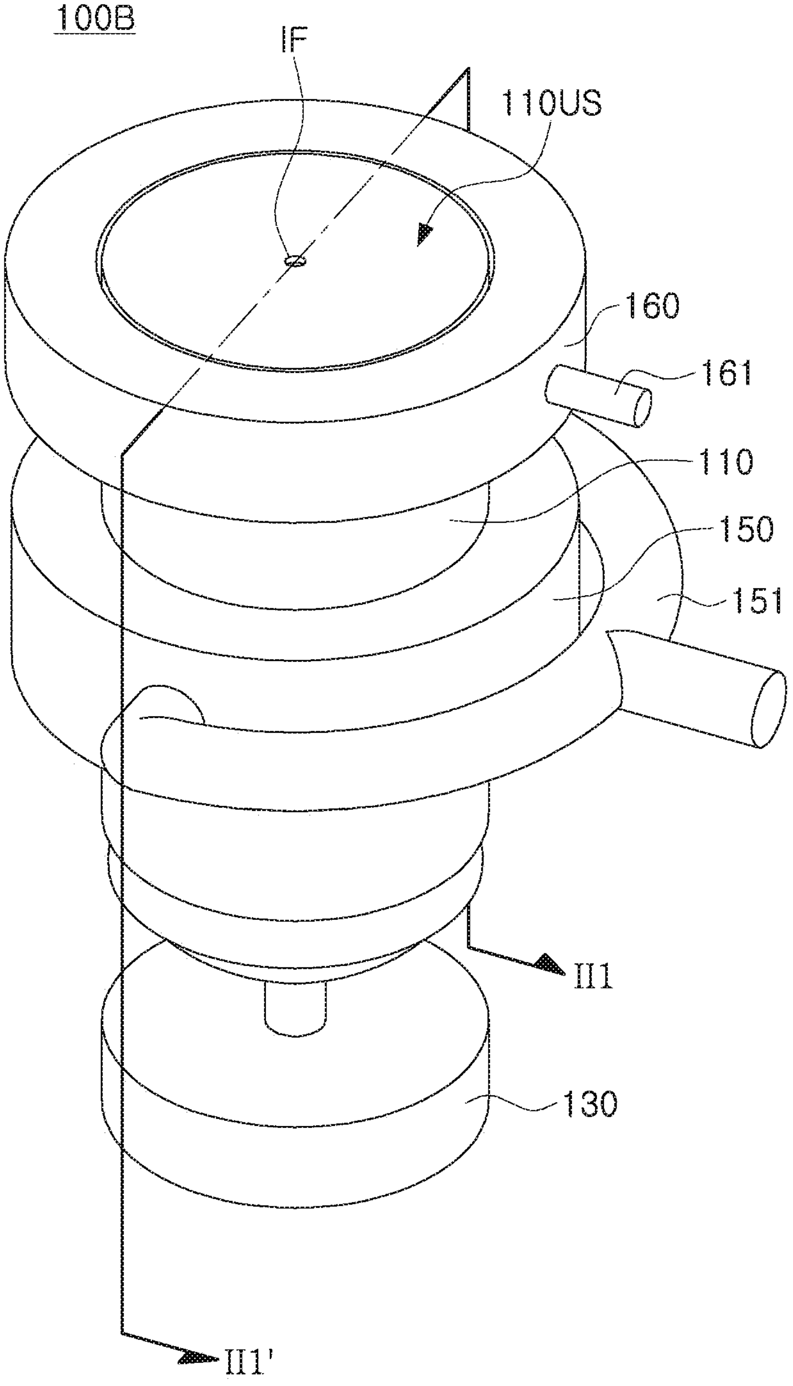
FIG. 3A is a perspective view schematically illustrating an extreme ultraviolet light source device according to various example embodiments.
Figure 3B:
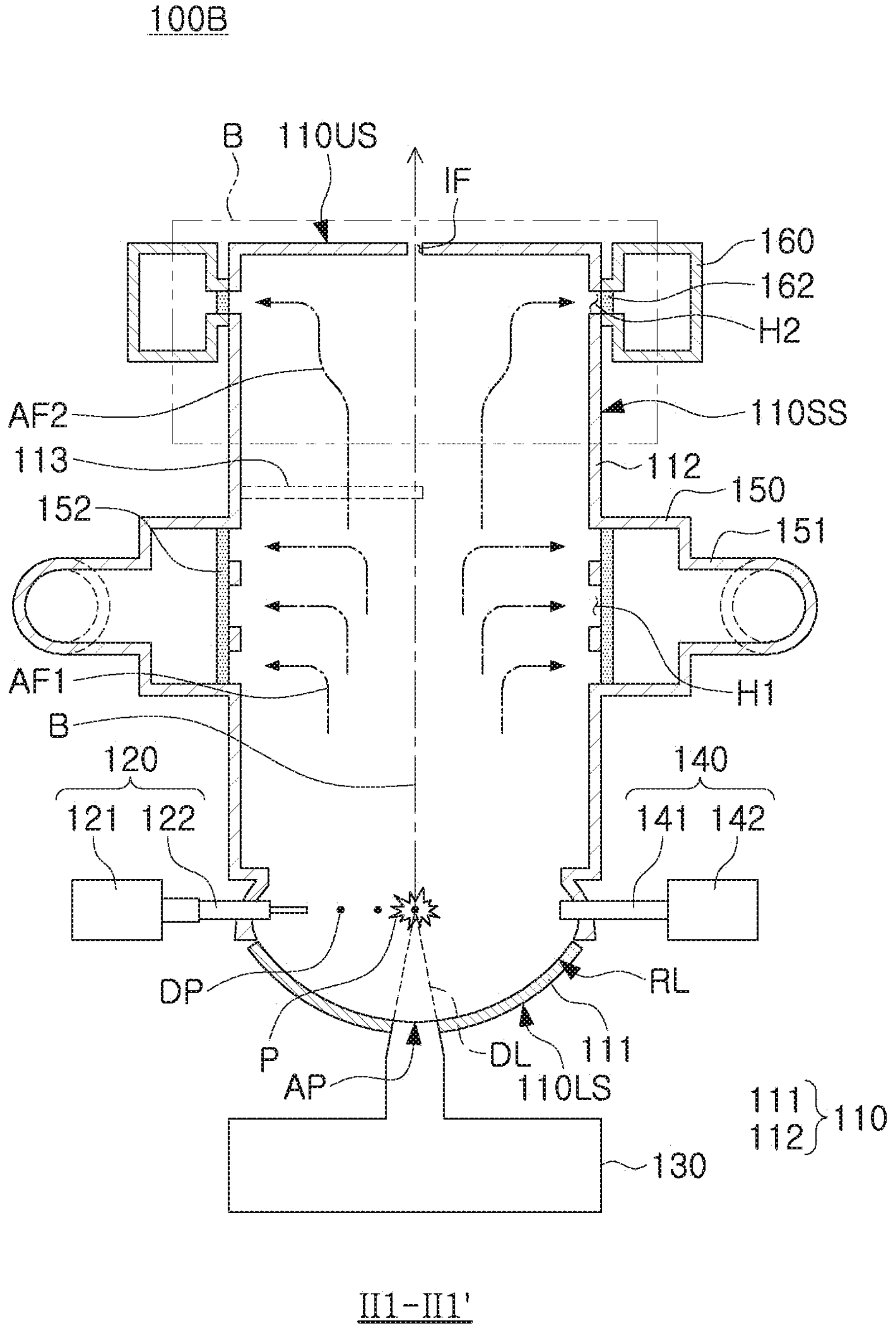
FIG. 3B is a cross-sectional view illustrating a cross-section taken along line of FIG. 3A.
Figure 3C:
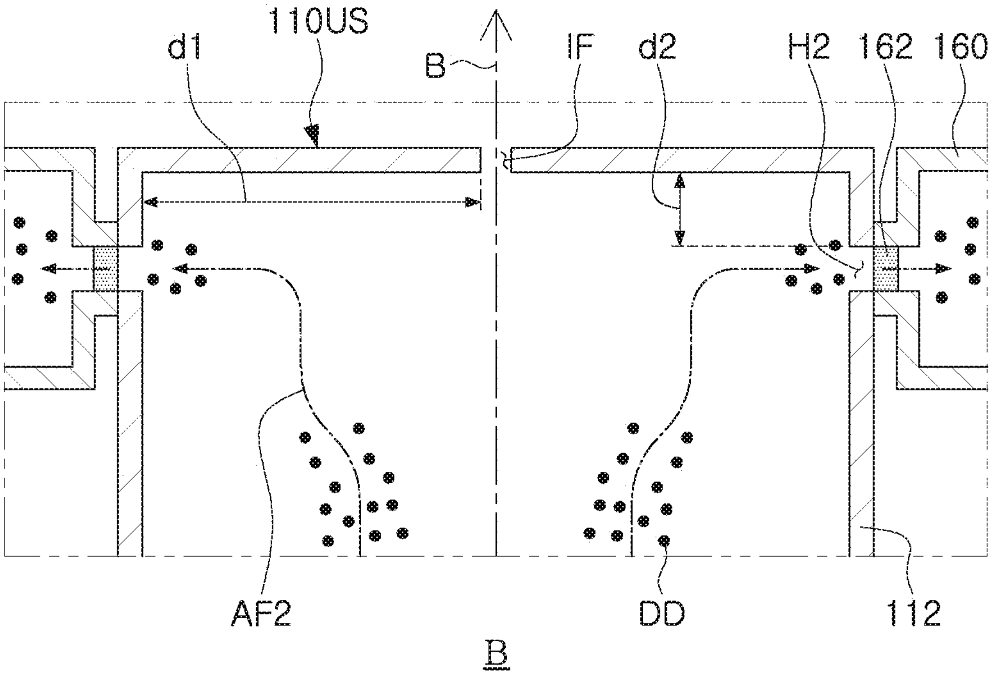
FIG. 3C is a partially enlarged view illustrating region B of FIG. 3B.

FIG. 3A is a perspective view schematically illustrating an extreme ultraviolet light source device 100B according to various example embodiments, NG, 3B is a cross-sectional view illustrating a cross-section taken along the line II1-II1' of FIG. 3A, and FIG. 3C is a partially enlarged view illustrating region B of FIG. 3B.

Referring to FIGS. 3A to 3C, the EUV light source device 100B according to various example embodiments may have the same or similar features as those described with reference to FIGS. 1A to 2C except for including at least one upper exhaust port located on a level, lower than the intermediate focus IF.

In order to prevent or reduce circulation of rising airflow and accumulation of debris DD in the vicinity of the intermediate focus IF, an upper exhaust port (e.g., a 'second exhaust port H2') of various example embodiments may be spaced apart from the intermediate focus IF in a horizontal direction by a first distance d1, and may be located within a second distance d2 from the intermediate focus IF in a vertical direction. The second distance d2 may be equal to or less than the first distance d1. For example, the first distance d1 may be greater than or equal to about 150 mm, and the second distance d2 may be less than or equal to about 150 mm. For example, the second exhaust port H2 may be formed on the side surface 110SS of the chamber 110, more adjacent to the intermediate focus IF than the first exhaust port H1. For example, the first exhaust port. H1 may be located on a first level, the second exhaust port H2 may be located on a second level, higher than the first level, and may be located on a third level, higher than the intermediate focus IF and the second exhaust port H2. As illustrated in FIG. 3C, since debris DD is sucked into the second exhaust unit 160 along the second rising airflow AF2 or accumulated around the second exhaust port H2, the debris DD may be prevented or reduced from passing through the intermediate focus IF.

The lower exhaust port (e.g., 'first exhaust port H1') of various example embodiments may be configured to discharge an airflow in the chamber 110 on a lower level than the upper exhaust port (e.g., 'second exhaust port H2'). For example, the first exhaust port H1 may be positioned beyond the second distance d2 from the intermediate focus IF in the vertical direction to discharge the first rising airflow AF1. As described above, the formation of a falling airflow or a circulating airflow inside the chamber 110 may be suppressed by the first exhaust port H1 and the second exhaust port H2, and as a result, accumulation of debris DD having a splitting angle toward the intermediate focus IF may be prevented or reduced.

Figure 4A:
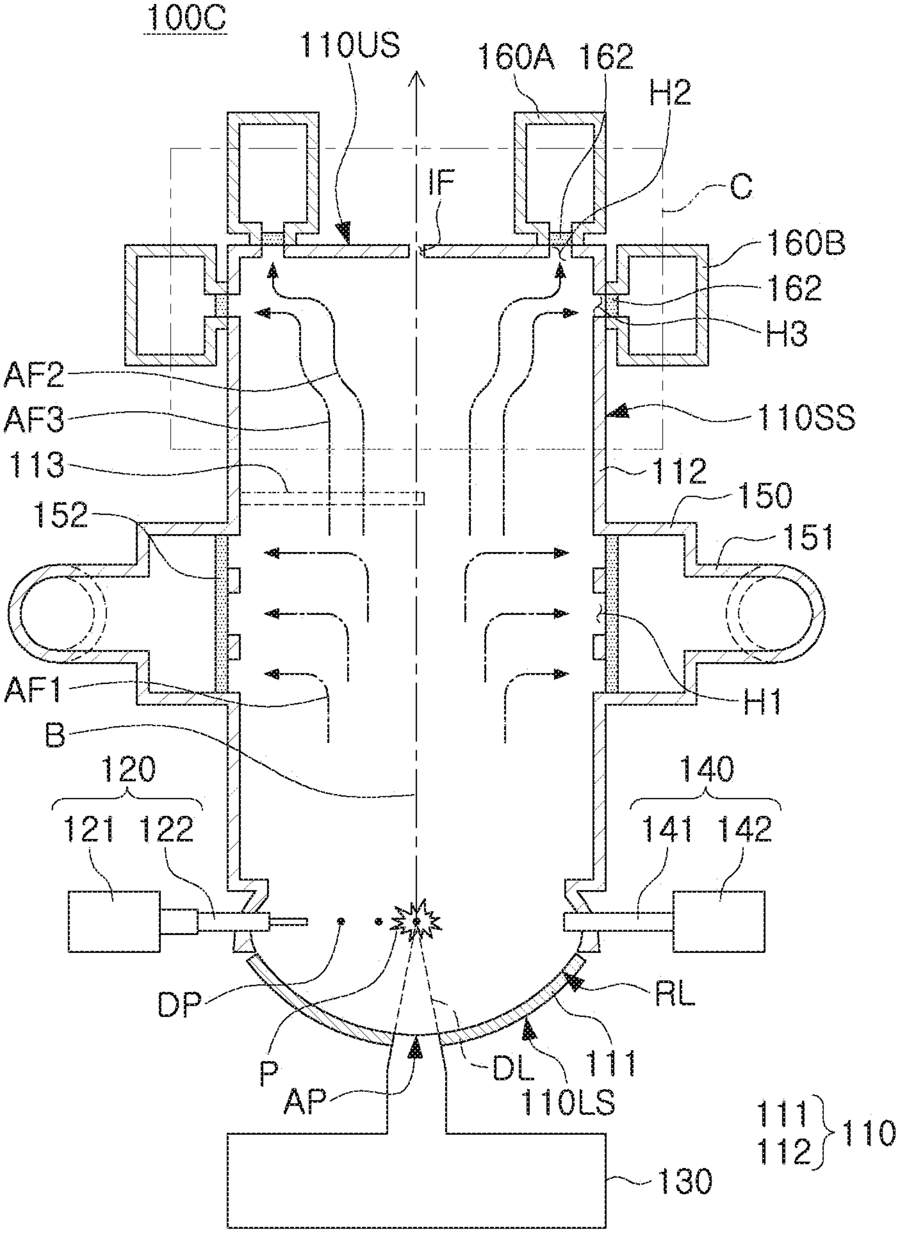
FIG. 4A is a schematic cross-sectional view of an extreme ultraviolet light source device according to various example embodiments.
Figure 4B:
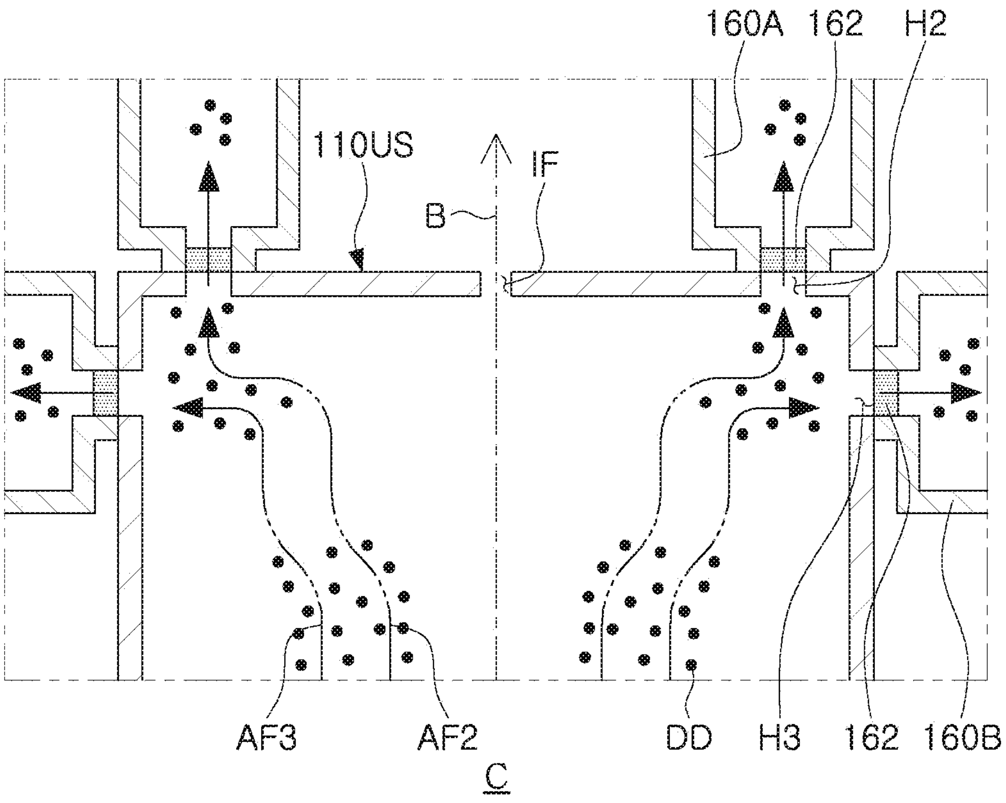
FIG. 4B is a partially enlarged view illustrating region C of FIG. 4A.

FIG. 4A is a cross-sectional view schematically illustrating an extreme ultraviolet light source device 100C according to various example embodiments, and FIG. 4B is a partially enlarged view illustrating the region 'C' of FIG. 4A.

Referring to FIGS. 4A and 4B, the ELY light source device 100C of various example embodiments may have the same or similar characteristics as those described with reference to FIGS. 1A to 3C except for including a second exhaust port H2, located at the same level as the intermediate focus IF and a third exhaust port H3, located on a level lower than the intermediate focus IF.

In various example embodiments, the second exhaust port H2 may be spaced apart from the intermediate focus IF by about 150 mm or more in a horizontal direction. The third exhaust port H3 may be spaced apart from the intermediate focus IF by about 150 mm or more in a horizontal direction, and positioned within about 150 mm from the intermediate focus IF in a vertical direction. For example, the third exhaust port H3 may have a separation distance of about 150 mm or less from the intermediate focus IF in a vertical direction parallel to the optical path of the extreme ultraviolet light B. The third exhaust port H3 may be formed on the side surface 110SS of the chamber 110, closer to the intermediate focus IF than the first exhaust port Ht.

The extreme ultraviolet light source device 1000 of various example embodiments may further include a first exhaust unit 150 connected to the first exhaust port H1, a second exhaust unit 160A connected to the second exhaust port H2, and a third exhaust unit 160B connected to the third exhaust port 113. The first exhaust unit 150 may be configured to discharge a first rising airflow AF1 in the chamber 110 through the first exhaust port H1. The second exhaust unit 160A may be configured to discharge a second rising airflow AF2 in the chamber 110 through the second exhaust port H2. The third exhaust unit 160B may be configured to discharge a third rising airflow AF3 in the chamber 110 through the third exhaust port H3. Accordingly, the formation of a falling or a circulating airflow inside the chamber 110 may be suppressed or at least partly suppressed, and as a result, accumulation of debris DD having a spitting angle toward the intermediate focus IF can be prevented or reduced.

Figure 5A:
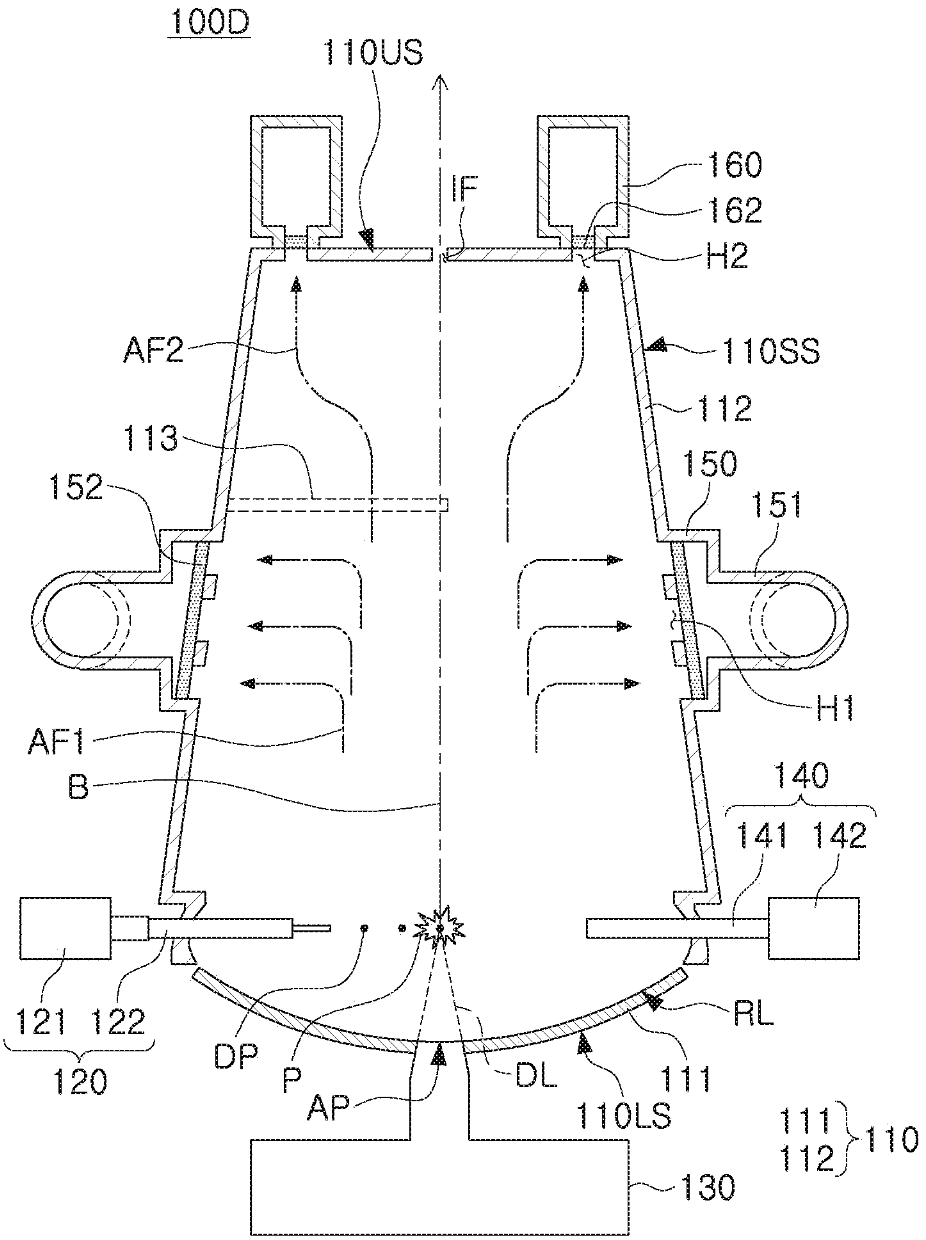
FIGS. 5A and 5B are cross-sectional views schematically illustrating an extreme ultraviolet light source device according to various example embodiments, respectively.
Figure 5B:
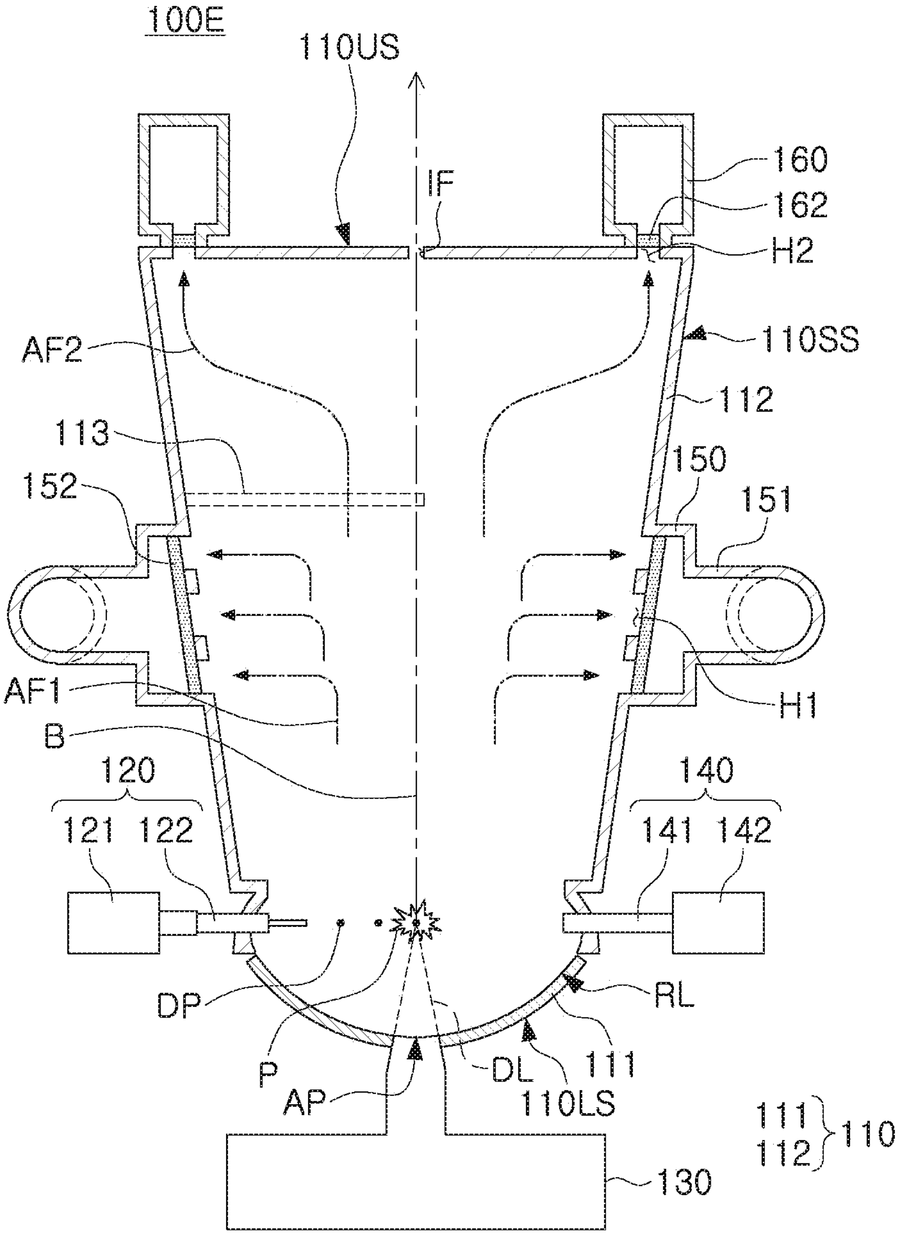

FIGS. 5A and 5B are cross-sectional views schematically illustrating extreme ultraviolet light source devices 100D and 100E according to various example embodiments, respectively.

Referring to FIGS. 5A and 5B, extreme ultraviolet light source devices 100D and 100E according to various example embodiments may have the same or similar features as those described with reference to FIGS. 1A to 4B except that a side surface 110SS includes a tapered chamber 110. In various example embodiments, the chamber 110 may have a shape in which the side surface 110SS is tapered. For example, as illustrated in FIG. 5A, the chamber 110 may have a tapered shape such that a width thereof narrows toward an upper surface 110US. Alternatively, as illustrated in FIG. 5B, the chamber 110 may have a tapered shape such that the width narrows toward a lower surface 110LS. The shape of the chamber 110 is not limited to those illustrated in FIGS. 1B, 5A, and 5B, and the chamber 110 may have a shape capable of securing a separation distance between an upper exhaust port (e.g., a 'second exhaust port H2') and an intermediate focus IF.

Figure 6:
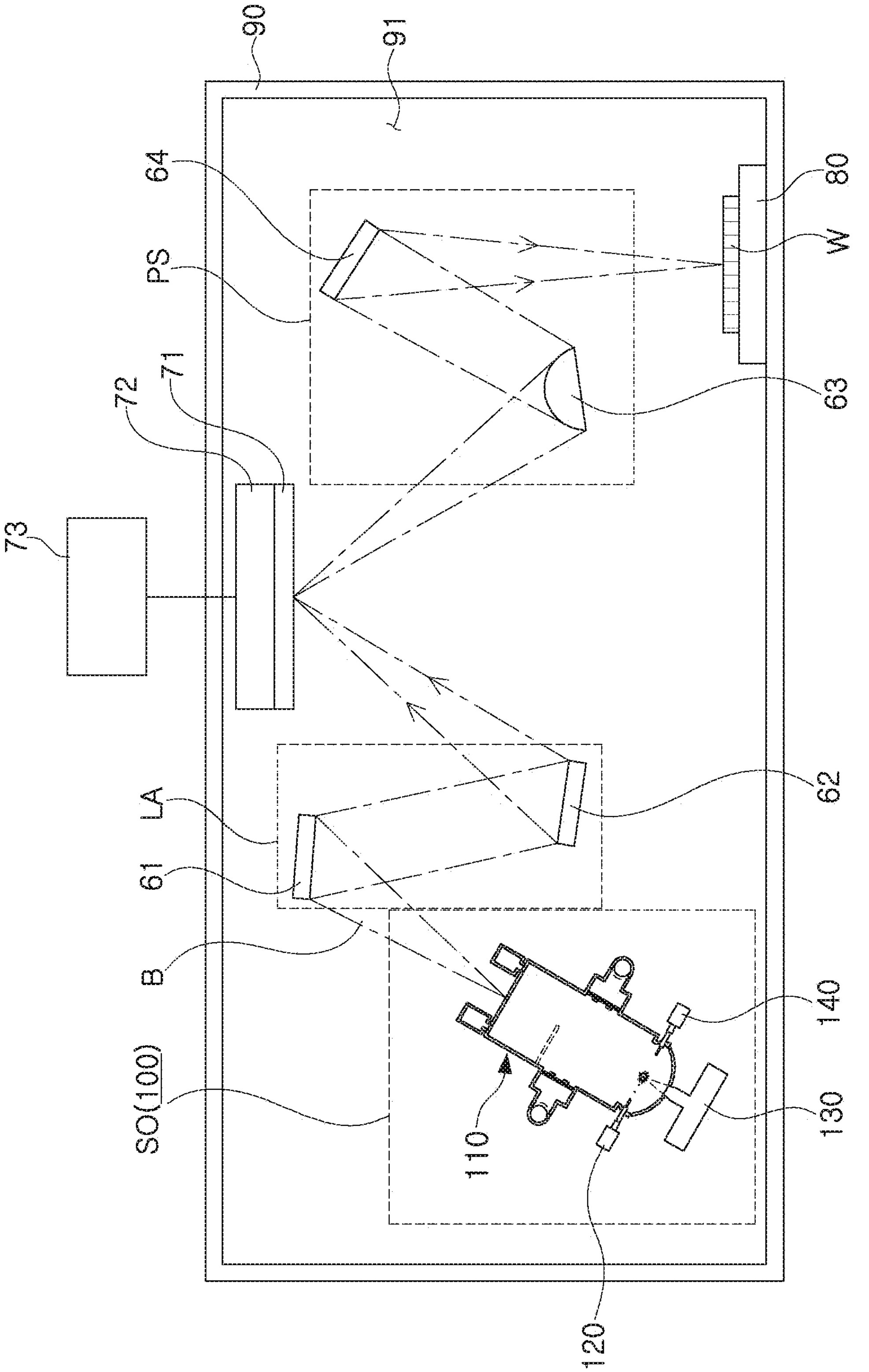
FIG. 6 is a diagram schematically illustrating an extreme ultraviolet exposure system employing an extreme ultraviolet light source system according to various example embodiments.

FIG. 6 is a diagram schematically illustrating an extreme ultraviolet exposure system employing an extreme ultraviolet light source system SO according to various example embodiments.

Referring to FIG. 6, an extreme ultraviolet exposure system according to various example embodiments may include an extreme ultraviolet light source system SO, a lighting system LA, and a projection system PS. Further, the extreme ultraviolet exposure system may include an exposure chamber 90, an upper electrostatic chuck (ESC) 72 on which a mask 71 is mounted, and a lower electrostatic chuck 80 on which a semiconductor wafer is mounted. Each component constituting or included in the extreme ultraviolet exposure system may be controlled by a controller (not shown). The control unit may be implemented with a processor such as, for example, one or more of is central processing unit (CPU), a graphic processing unit (GPU), a microprocessor, an application specific integrated circuit (ASIC), a field programmable gate array (FPGA), and the like, and may include a memory for storing various data, required for an operation of the extreme ultraviolet exposure system.

The exposure chamber 90 has an internal space 91, and an extreme ultraviolet light source system SO, a lighting system LA, a projection system PS, and the like may be disposed in the internal space 91. Depending on various example embodiments, some or all of the components may be disposed externally of the exposure chamber 90. For example, a portion of the extreme ultraviolet light source system SO may be disposed externally of the exposure chamber 90. To prevent or reduced extreme ultraviolet light B that is generated by the extreme ultraviolet light source system SO from being absorbed to gas, the internal space 91 of the exposure chamber 90 may be may be in a low-pressure state of about 5 Pa or less or n a vacuum state. An upper electrostatic chuck 72 and a lower electrostatic chuck 80 may be disposed in the internal space 91. The upper electrostatic chuck 72 may be loaded/unloaded with the mask 71 by electrostatic force generated by power applied from a power supply unit 73, and the lower electrostatic chuck 80 may be loaded/unloaded with a substrate such as a semiconductor wafer.

The extreme ultraviolet (EUV) light source system SO may generate extreme ultraviolet EUV light B having a wavelength of less than about 100 nm. Referring to FIG. 1B together, the EUV light source system SO may be a laser-produced plasma (LPP) light source, generating plasma P, by irradiating a laser DL, oscillated from the light source unit 130 to a droplet DP made of any one or more of tin (Sn), lithium (Li), and xenon (Xe). Depending on the example embodiment, as the EUV light source system SO, a so-called Master Oscillator Power Amplifier (MOPA) method may be used. That is, a pre-pulse and a main pulse may be generated using a seed laser, irradiated from the light source unit 130, and the pre-pulse may be irradiated to the droplet DP to expand the same, and then extreme ultraviolet (EUV) light may be emitted using plasma P generated by re-irradiating the main pulse to the droplet DP. Inside the chamber 110 of the extreme ultraviolet light source system SO, the laser DL supplied by the light source unit 30 and the droplet DP supplied by the droplet supply unit 120 collide more than 50,000 times per second, so that plasma P may be generated. The condensing mirror 111 of the chamber 110 may collect extreme ultraviolet light B emitted from the plasma P in all directions, concentrate the extreme ultraviolet light B forward, and provide the same to the lighting system LA.

The extreme ultraviolet light source system SO may include one or more or all of the features of the extreme ultraviolet light source devices described with reference to FIGS. 1A to 5B. For example, referring to FIG. 11B together, the extreme ultraviolet (EUV) light source system SO may include a chamber 110 having a condensing mirror 111, an intermediate focus IF from which extreme ultraviolet (EUV) light B, reflected from the condensing mirror 111, is emitted, and first and second exhaust ports H1 and 112 disposed between the condensing a mirror 111 and the intermediate focus IF; a droplet supply unit 120 configured to supply a droplet DP for generating extreme ultraviolet light B into the chamber 110; a light source unit 130 configured to generate extreme ultraviolet light B from the droplet. DP by oscillating a laser DL; a catcher 140 configured to receive the droplet DP discharged from the droplet supply unit 120; a first exhaust unit 150 configured to discharge a first rising airflow AF1 through the first exhaust port H1; and a second exhaust unit 160 configured to discharge a second rising airflow AF2 through the second exhaust port H2.

The lighting system LA may include a plurality of mirrors, to irradiate the EUV light B, emitted from the EUV light source system SO toward the upper electrostatic chuck 72. Since the plurality of mirrors included in the lighting system LA have a known structure, only two mirrors 61 and 62 are illustrated for simplicity of drawing and convenience of explanation.

The projection system PS may include a plurality of mirrors, to irradiate a pattern of extreme ultraviolet light B, reflected from s mask 71 attached to the upper electrostatic chuck 72 to the substrate W disposed on the lower electrostatic chuck 80, so that the pattern may be exposed on a surface of the substrate W. Since the plurality of mirrors included in the projection system PS have a known structure, only two mirrors 63 and 64 are illustrated for simplicity of drawing and convenience of description.

As set forth above, according to example embodiments, an extreme ultraviolet light source device in which contamination by debris and outflow of debris are prevented or reduced, by forming exhaust ports for suppressing circulation of airflow and accumulation of debris in the chamber, may be provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments have been shown and described above, it will be apparent to those of ordinary skill in the art that modifications and variations could be made without departing from the scope as defined by the appended claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. An extreme ultraviolet light source device, comprising:

a chamber having a lower surface on which a condensing mirror is arranged, the chamber having an upper surface having an intermediate focus that is configured to have extreme ultraviolet light, reflected by the condensing mirror, be emitted, and the chamber having a side surface between the lower surface and the upper surface, the chamber including a first exhaust port on the side surface, and a second exhaust port on the upper surface on a level equal to or lower than a level of the intermediate focus and spaced apart from the intermediate focus;

a droplet supply adjacent to the side surface of the chamber, and configured to supply a droplet to generate the extreme ultraviolet light in the chamber;

a light source adjacent to the lower surface of the chamber, and configured to generate the extreme ultraviolet light from the droplet by oscillating a laser;

a catch adjacent to the side surface of the chamber, opposite to the droplet supply, and configured to receive the droplet that is discharged from the droplet supply;

a first exhaust adjacent to the side surface of the chamber, and connected to the first exhaust port; and a second exhaust adjacent to the upper surface of the chamber, and connected to the second exhaust port.

2. The extreme ultraviolet light source device of claim 1, wherein the first exhaust is configured to discharge a first rising airflow in the chamber through the first exhaust port, and the second exhaust is configured to discharge a second rising airflow in the chamber through the second exhaust port.

3. The extreme ultraviolet light source device of claim 1, wherein the intermediate focus and the second exhaust port are on a same level.

4. The extreme ultraviolet light source device of claim 1, wherein the second exhaust port is on a level above that of the first exhaust port.

5. The extreme ultraviolet light source device of claim 1, wherein the second exhaust port is spaced apart from the intermediate focus, in a horizontal direction that is perpendicular to an optical path of the extreme ultraviolet light.

6. The extreme ultraviolet light source device of claim 5, wherein a separation distance between the second exhaust port and the intermediate focus in the horizontal direction is 150 mm or more.

7. The extreme ultraviolet light source device of claim 1, wherein the second exhaust port is provided as a plurality of second exhaust ports surrounding the intermediate focus.

8. The extreme ultraviolet light source device of claim 7, wherein the plurality of second exhaust ports comprise outer exhaust ports adjacent to an edge of the chamber and inner exhaust ports between the outer exhaust ports and the intermediate focus.

9. The extreme ultraviolet light source device of claim 1, wherein the chamber further has a third exhaust port on the side surface to be more adjacent to the upper surface than the first exhaust port, wherein the extreme ultraviolet light source device further comprises a third exhaust, connected to the third exhaust port.

10. The extreme ultraviolet light source device of claim 9, wherein the third exhaust port is spaced apart from the intermediate focus in a vertical direction that is parallel to an optical path of the extreme ultraviolet light.

11. The extreme ultraviolet light source device of claim 10, wherein a separation distance between the third exhaust port and the intermediate focus in the vertical direction is 150 mm or less.

12. The extreme ultraviolet light source device of claim 1, wherein the chamber has a cylindrical shape.

13. The extreme ultraviolet light source device of claim 1, wherein the chamber has a shape in which the side surface thereof is tapered.

14. The extreme ultraviolet light source device of claim 1, wherein the first exhaust and the second exhaust comprise a scrubber respectively arranged in the first exhaust port and the second exhaust port.

15. An extreme ultraviolet light source device, comprising:

a chamber including a condensing mirror, and a body on the condensing mirror and having an intermediate focus that is configured to have extreme ultraviolet light that is reflected by the condensing mirror be emitted, and the chamber including first and second exhaust ports that are spaced apart from the intermediate focus;

a droplet supply configured to supply a droplet to generate the extreme ultraviolet light in the chamber;

a light source configured to generate the extreme ultraviolet light from the droplet by oscillating a laser;

a catch configured to receive the droplet discharged from the droplet supply;

a first exhaust connected to the first exhaust port; and a second exhaust connected to the second exhaust port, wherein the first exhaust port is on a first level, and the second exhaust port is on a second level above the first level, the second level is equal to or lower than a level of the intermediate focus.

16. An extreme ultraviolet light source device, comprising:

a chamber having an intermediate focus which is configured to have extreme ultraviolet light that is reflected by a condensing mirror be emitted, and at least one upper exhaust port on an upper surface of the chamber, spaced apart from the intermediate focus by a first distance in a horizontal direction, located at a level equal to or lower than a level of the intermediate focus within a second distance in a vertical direction;

a droplet supply configured to supply a droplet to generate the extreme ultraviolet light in the chamber;

a light source unit configured to generate the extreme ultraviolet light from the droplet by oscillating a laser; and a catch configured to receive the droplet discharged from the droplet supply.

17. The extreme ultraviolet light source device of claim 16, wherein the second distance is less than or equal to the first distance.

18. The extreme ultraviolet light source device of claim 16, wherein the chamber further includes at least one lower exhaust port beyond the second distance from the intermediate focus in a vertical direction.

19. The extreme ultraviolet light source device of claim 18, wherein the at least one lower exhaust port is configured to discharge a first rising airflow in the chamber, and the at least one upper exhaust port is configured to discharge a second rising airflow in the chamber.

* * * * *